US008558711B2

(12) United States Patent
Savage, Jr. et al.

(10) Patent No.: US 8,558,711 B2
(45) Date of Patent: Oct. 15, 2013

(54) SYSTEM FOR TESTING NAC OPERABILITY USING BACKUP POWER

(75) Inventors: Kenneth E. Savage, Jr., Fitchburg, MA (US); Anthony J. Capowski, Westford, MA (US); Mark P. Barrieau, Baldwinville, MA (US)

(73) Assignee: SimplexGrinnell LP, Westminster, MA (US)

( * ) Notice: Subject to any disclaimer, the term of this patent is extended or adjusted under 35 U.S.C. 154(b) by 721 days.

(21) Appl. No.: 11/825,213

(22) Filed: Jul. 5, 2007

(65) Prior Publication Data

US 2009/0009352 A1    Jan. 8, 2009

Related U.S. Application Data

(63) Continuation-in-part of application No. 11/282,358, filed on Nov. 18, 2005, now Pat. No. 7,333,010.

(51) Int. Cl.
*G08B 21/00* (2006.01)

(52) U.S. Cl.
USPC ........... 340/660; 340/679; 340/628; 320/137; 307/64

(58) Field of Classification Search
USPC .................. 340/600–664, 679; 324/72, 72.5; 320/137; 307/64, 65
See application file for complete search history.

(56) References Cited

U.S. PATENT DOCUMENTS

| | | | | |
|---|---|---|---|---|
| 3,629,657 A | * | 12/1971 | Paddison et al. | 361/79 |
| 4,544,921 A | * | 10/1985 | Fujisawa | 340/584 |
| 5,191,291 A | * | 3/1993 | Taylor | 324/429 |
| 5,218,353 A | * | 6/1993 | Okumura et al. | 340/815.65 |
| 5,424,617 A | * | 6/1995 | Garbowicz et al. | 315/289 |
| 5,635,813 A | * | 6/1997 | Shiga et al. | 320/106 |
| 5,661,463 A | * | 8/1997 | Letchak et al. | 340/636.15 |
| 5,800,472 A | * | 9/1998 | Mann | 607/29 |
| 6,567,001 B1 | * | 5/2003 | Barrieau et al. | 340/506 |
| 7,113,102 B2 | * | 9/2006 | Soemantri | 340/635 |
| 2007/0108986 A1 | * | 5/2007 | Moore et al. | 324/522 |

FOREIGN PATENT DOCUMENTS

WO    WO93/25917    * 12/1993

* cited by examiner

*Primary Examiner* — George Bugg
*Assistant Examiner* — Edny Labbees
(74) *Attorney, Agent, or Firm* — Brinks Hofer Gilson & Lione

(57) ABSTRACT

A monitoring system for a NAC (Notification Appliance Circuit) is provided. The monitoring system includes a system controller, and a NAC comprised of notification appliances that may be in a series. The NAC and its appliances may be operatively coupled to the system controller. The system controller is operable to determine whether a notification appliance has sufficient voltage at a low voltage operation.

27 Claims, 5 Drawing Sheets

SYSTEM FOR TESTING NAC OPERABILITY USING BACKUP POWER

REFERENCE TO RELATED APPLICATION

This application is a continuation in part of U.S. application Ser. No. 11/282,358, filed on Nov. 18, 2005, (now U.S. Pat. No. 7,333,010).

BACKGROUND

A fire alarm system typically includes one or more notification appliances that notify the public of fire or smoke. A Notification Appliance Circuit (NAC) connects the notification appliances to a fire alarm control panel. A primary power source (such as line power from an AC line) may supply power to the fire alarm control panel. The fire alarm system may also include a backup voltage source that supplies power to the fire alarm control panel. The backup voltage source is generally a low voltage source (such as a battery) that is used when the primary power source is unavailable. The NAC may provide power from the control panel to the notification appliances. The notification appliances draw a significant amount of current from the NAC and create a voltage drop across the NAC. The voltage drop may reduce the voltage supplied to the notification appliances at the end of the NAC (opposite the control panel) to a level that is below the voltage necessary to power the notification appliance.

During the design of the fire alarm system, a designer estimates whether all the notification appliances will have sufficient voltage to operate. To make this estimation, the designer predicts the voltage drop from the fire alarm panel to the last notification device. The voltage drop calculation is based on the length of the NAC, the resistance of the NAC, and the current draw of the appliances. The designer then subtracts the predicted voltage drop from the output voltage of the fire alarm panel and compares the result to the minimum operating voltage of the notification appliance. The NAC design is acceptable when the calculated voltage is above the minimum operating voltage of the notification appliance. However, the installed system may differ from the designed system. For example, the length of the NAC may differ due to practical considerations in the building, or alternate routings of the wires by the electrical installers. The actual voltage drop on a NAC in the installed system is frequently different than the calculated voltage drop. Therefore, it is important to confirm, after installation, that the NAC has sufficient voltage to operate the notification appliances.

Conventionally, it was difficult to test the voltage drop in an installed system. It was even more difficult to test the voltage drop at or near the lowest suitable voltage on the NAC. The lowest suitable voltage on the NAC is generally the voltage supplied from the control panel when the backup power source, for example, one or more batteries, are at the end of their rated life. The NAC voltage drop is difficult to determine at the lowest suitable voltage because the typical output voltage (supplied by the primary power source) of the control panel is significantly higher than the output voltage when the backup power source is supplying power. For example, the primary AC power source may supply a voltage that is many volts higher than the voltage supplied by the backup batteries, and thus the voltage output from the control panel is substantially different.

Because the notification appliances draw more current at low voltage than they do at higher voltages, an accurate measurement at the lowest voltage is difficult to obtain. If less current is drawn from the NAC, then the voltage drop across the NAC will also be reduced. Measuring the voltage at the control panel and then at the last notification appliance during higher voltage operation (supplied by the primary power source or the backup power source at the beginning of its rated life), will not give an accurate measurement of the voltage drop in the system during the lowest voltage operation (i.e. when the battery is at the end of its rated life).

In current systems the only way to measure the voltage drop on a NAC during the lowest voltage operation and verify that it is within its designed parameters, is to power the system from batteries for an extended period of time, until the batteries are near their rated end of life and then activate the notification appliances and measure the voltage drop on each NAC. This is generally not practical and is often not done because it is time consuming and potentially damaging to the batteries. Accordingly, a need exists for testing whether the NAC is capable of operating from batteries that is simple in design and operation.

SUMMARY

The present embodiments relate to a diagnostic monitoring system that determines whether the NAC is capable of operating on backup power. For example, the diagnostic monitoring system may measure the voltage drop across a NAC when the control panel is supplied with power from any output voltage, and calculates the voltage drop in the system during a lower voltage operation (such as when powered by backup or battery power). In this manner, the voltage drop across a NAC during the lower voltage operation can be tested after installation of the fire alarm system.

A fire alarm system may include one or more notification appliances connected in a series across a NAC. A NAC controller may be disposed on one end of the NAC, and a NAC measurement device may be disposed on the other end of the NAC. The NAC controller and NAC measurement device may be in communication with a system controller.

The NAC may supply one or more notification appliances with power. The notification appliances are constant power consumption devices that draw current from the NAC. Consequently, the power consumption of the NAC during normal operation is substantially similar to the power consumption of the NAC during low voltage operation. For example, if the voltage on the NAC is decreased (such as when the primary power source is unavailable and the backup power source supplies power to the NAC), the NAC current will subsequently increase.

The monitoring system may determine the NAC impedance. The NAC impedance may be determined by estimating the NAC impedance, such as by accessing a memory, by performing calculations in real-time, or some combination thereof. For example, the NAC impedance may be determined by accessing a stored value of the impedance in a system memory. The NAC impedance may be determined before or during installation of the monitoring system. Once determined, the impedance may be stored in the system memory, which communicates with the system controller. When the impedance is needed or desired, the system controller may access the impedance from the system memory.

The NAC impedance may also be determined by calculating an estimate of the impedance in real-time. The NAC impedance, during normal operation of the NAC, may be estimated based on the average voltage of the NAC and the NAC current. A first voltage measurement device may be disposed at a first end of the NAC and a second voltage measurement device may be disposed at a side opposite to the first end of the NAC. The first and second voltage measurement devices communicate voltage values at the two ends of the NAC to the system controller. The system controller averages the two end voltage values. A current measurement device may be used to determine the current supplied to the NAC. The current measurement device communicates the NAC current to the system controller. The system controller determines the NAC impedance by analyzing the average voltage of the NAC and the NAC current.

The NAC impedance may be determined in real-time and stored in the system memory. The stored value may be used for future comparisons, determinations, or other suitable uses. For example, the NAC impedance estimated in real-time, as discussed above, may be compared to previously stored NAC impedance values. The comparison may be used to check for errors in the NAC. Alternatively, since the NAC impedance should remain substantially the same over time, the NAC impedance may be determined in real-time, as described above, and then stored in a system memory for future determinations of the impedance value.

The monitoring system may determine the voltage drop by approximating a voltage drop across the NAC at low voltage operation based on the impedance. The voltage drop across the NAC reflects, for example, the loss of voltage to the NAC appliances and the wiring system coupling the NAC appliances to the system controller. Accordingly, the voltage drop across the NAC is based on the NAC impedance value (as discussed above) and an approximated current value at low voltage operation. Because the NAC appliances are constant power consumption devices, the current value at low voltage operation may be approximated by analyzing the power consumption of the NAC (at normal operation when being power by the power line) and the average voltage of the NAC at low voltage operation (such as being powered by a battery).

As discussed above, the average power consumption of the NAC may remain substantially the same at normal operation and low voltage operation. The monitoring system may determine the average power consumption of the NAC (at normal operation and low voltage operation) by analyzing the average voltage of the NAC and the NAC current.

The average voltage at low voltage operation may be determined by averaging the voltage supplied to the NAC from the backup voltage source and the minimum voltage needed for a NAC appliance to maintain functionality ("minimum NAC appliance voltage"). As discussed above, because the NAC impedance and power consumption may remain constant during normal operation and low voltage operation, the voltage consumed (i.e. voltage drop) on the NAC at low voltage operation may be determined.

Based on the voltage drop and impedance, the monitoring system may determine if a resulting parameter is sufficient. For example, the resulting parameter may be determined by subtracting the voltage drop value from the voltage supplied to the NAC by the backup voltage source. If the resulting parameter is less than the minimum NAC appliance voltage, the NAC will have insufficient voltage to maintain functionality of the Notification appliances during low voltage operation. If the resulting voltage is greater than or equal to the minimum Notification appliance voltage, the NAC will have sufficient voltage to maintain functionality of the notification appliances.

Other systems, methods, features and advantages will be, or will become, apparent to one with skill in the art upon examination of the following figures and detailed description. It is intended that all such additional systems, methods, features and advantages be included within this description, be within the scope of the invention, and be protected by the following claims.

DETAILED DESCRIPTION

Figure 1:
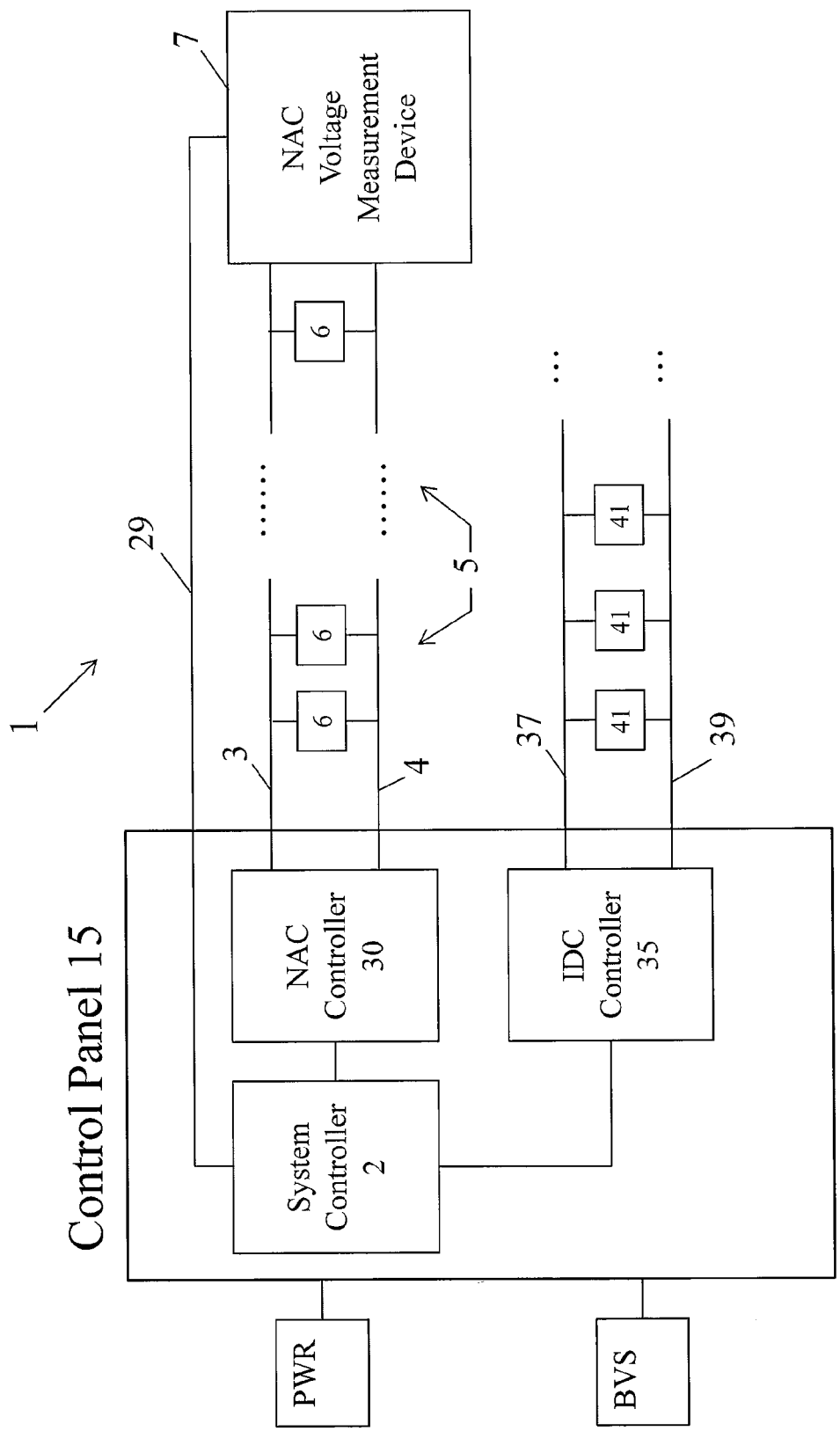
FIG. 1 illustrates one embodiment of a NAC diagnostic system.

FIG. 1 shows one example of a monitoring system 1. The monitoring system 1 may comprise a fire alarm system, a security system, an elevator system, an HVAC system, or the like. The monitoring system 1 includes a NAC 5 comprising one or more NAC appliances 6. The NAC appliances 6 are controlled by a NAC controller 30. In one example, the NAC appliances 6 are not individually addressable, and receive a command to activate all of the NAC appliances at once. As another example, the NAC appliances 6 may be individually addressable and may be activated individually so that one, some, or all of the NAC appliances are activated.

The monitoring system 1 may include a control panel 15 that includes a system controller 2, the NAC controller 30, and an IDC controller 35. The IDC controller may monitor an initiating device circuit (IDC) that includes lines 37 and 39, and one or more detection devices 41 (such as smoke detectors, pull stations, etc.) The IDC controller 35 may send a communication to the system controller 2 regarding one, some, or all of the detection devices (such as a communication that a smoke detector has detected smoke). The system controller 2 may communicate with the NAC controller 2 in order to activate one or more of the NAC appliances 6 in the NAC 5.

Figure 2:
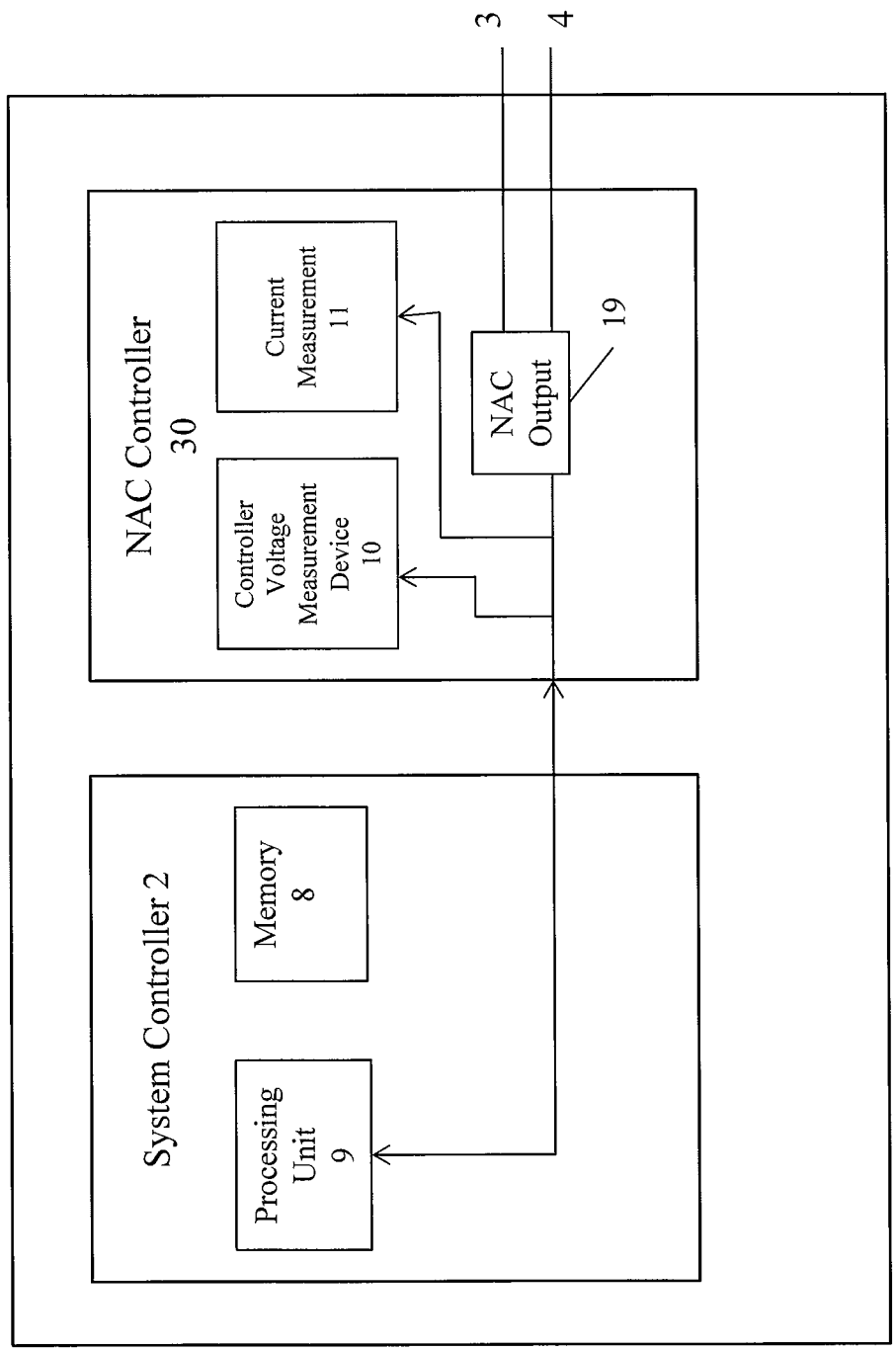
FIG. 2 illustrates one embodiment of a system controller in communication with a NAC controller.

As discussed in more detail in FIG. 2, the system controller 2 includes a processing unit 9 and a memory 8. The NAC controller 30 includes a controller voltage measurement device 10 and a current measurement device 11, and NAC output 19 (including NAC output terminals 3 and 4).

The monitoring system 1 may further include a primary power supply PWR that supplies power to the monitoring system 1. FIG. 1 depicts that the primary power supply PWR is input to the control panel 15. The primary power supply PWR may be input to any part of the monitoring system 1. The primary power supply PWR may supply AC or DC power. For example, the primary power supply PWR may include an AC power source ranging from, for example, 100 Vac to 240 Vac; more preferably 120 Vac. The primary power supply PWR may include an AC/DC converter that converts a supplied AC power to DC power. The converted power may be supplied to the system controller 2. The control panel 15 may include an AC/DC converter, DC/DC converter, or the combination thereof.

A backup voltage source BVS may supply power to the monitoring system 1. FIG. 1 depicts that the backup voltage source BVS is input to the control panel 15. The backup voltage source BVS may be input to any part of the monitoring system 1. The backup voltage source BVS may comprise a battery, a generator, or any suitable low voltage source. In the event that the power supply PWR is unavailable, unable to sufficiently supply a voltage, or unreliable, the backup voltage source BVS supplies a sufficient voltage to the monitoring system 1. The backup voltage source BVS may supply a voltage to the monitoring system 1 independent of the power supply PWR (a complete switch from PWR to BVS). Alternatively, the backup voltage source BVS may supplement the voltage supplied from the power supply PWR.

The control panel 15 may operate using the power supplied from the primary power supply PWR or the backup voltage source BVS. As discussed above, the primary power supply PWR and the backup voltage source BVS may supply power to the NAC appliances 6 via the NAC 5. The system controller 2 or the NAC controller 30 may draw current from the power supplied and create a voltage drop before the power is supplied to the NAC 5. For example, the voltage supplied to the NAC 5 may be less than the voltage supplied to the system controller 2.

As discussed in more detail below, the monitoring system 1 may determine the voltage drop by approximating a voltage drop across the NAC 5 at low voltage operation based on the impedance to determine whether there is sufficient voltage to operate the NAC 5 at low voltage. The electronics to make the determination (including the electronics to control measurement of the voltage and current to determine the impedance, and to determine the voltage drop) may be resident anywhere in the monitoring system 1. As discussed in more detail below, the electronics acting as the controller is resident in a system controller, such as system controller 2 for the fire alarm system. Alternatively, the electronics acting as the controller may be resident in NAC controller 30. Or, the electronics acting as the controller may be resident in a different portion of monitoring system 1.

The NAC controller 30 may monitor various inputs and control various outputs of the monitoring system 1 using one or more sensors that sense one or more electrical parameters (such as voltage or current) of the NAC. As discussed in more detail below, one or more devices may comprise the sensors that sense the electrical parameter(s), such as NAC voltage measurement device 7.

As shown in FIG. 2, the system controller 2 may send a command to the NAC Controller 30. The NAC controller 30 may then activate NAC 5 via terminals 3 and 4 of NAC output 19. Further, the NAC controller 30 voltage measurement device 10 measures a voltage that is output from the NAC controller 30 to the NAC 5. The controller voltage measurement device 10 determines an initial NAC voltage value $V_{NAC-1}$, which represents the amount of voltage being supplied to the NAC 5. The current measurement device 11 measures a current supplied to the NAC 5. The current measurement device 11 determines a current value $I_{NAC}$, which represents the current supplied to the NAC 5.

Though FIG. 2 depicts the NAC controller voltage measurement device 10 and controller current measurement device 11 as a part of the NAC controller 30, the controller voltage measurement device 10 and controller current measurement device 11 may be disposed as part of the system controller 2 or as individual elements outside the NAC controller 30. For example, the controller voltage measurement device 10 and controller current measurement device 11 may be disposed outside of the NAC controller 30.

The NAC appliances 6 comprise notification appliances. The NAC appliances 6 may also be constant power consumption devices. When an alarm condition is sensed by a detection device, the system controller 2 may signal the alarm to the notification appliances through the NAC 5. Notification appliances may include, for example, a visual alarm (strobe), an audible alarm (horn), a speaker, or a combination thereof. Though only one NAC 5 is shown in FIG. 1, additional NACs may be connected to the system controller 2.

As discussed above, the monitoring system 1 may also include a NAC voltage measurement device 7. One or more NAC voltage measurement devices 7 may be coupled to the NAC 5. As shown in FIG. 1, the NAC voltage measurement device 7 is disposed at one end of the NAC 5, with the NAC controller 30 at the other end, and the NAC appliances 6 disposed in between. In this way, the NAC voltage measurement device 7 is connected to NAC 5 after the NAC appliance 6 located furthest from the NAC controller 30. Alternatively, the NAC voltage measurement device 7 may be connected to the NAC 5 after any of the NAC appliances 6.

Figure 3:
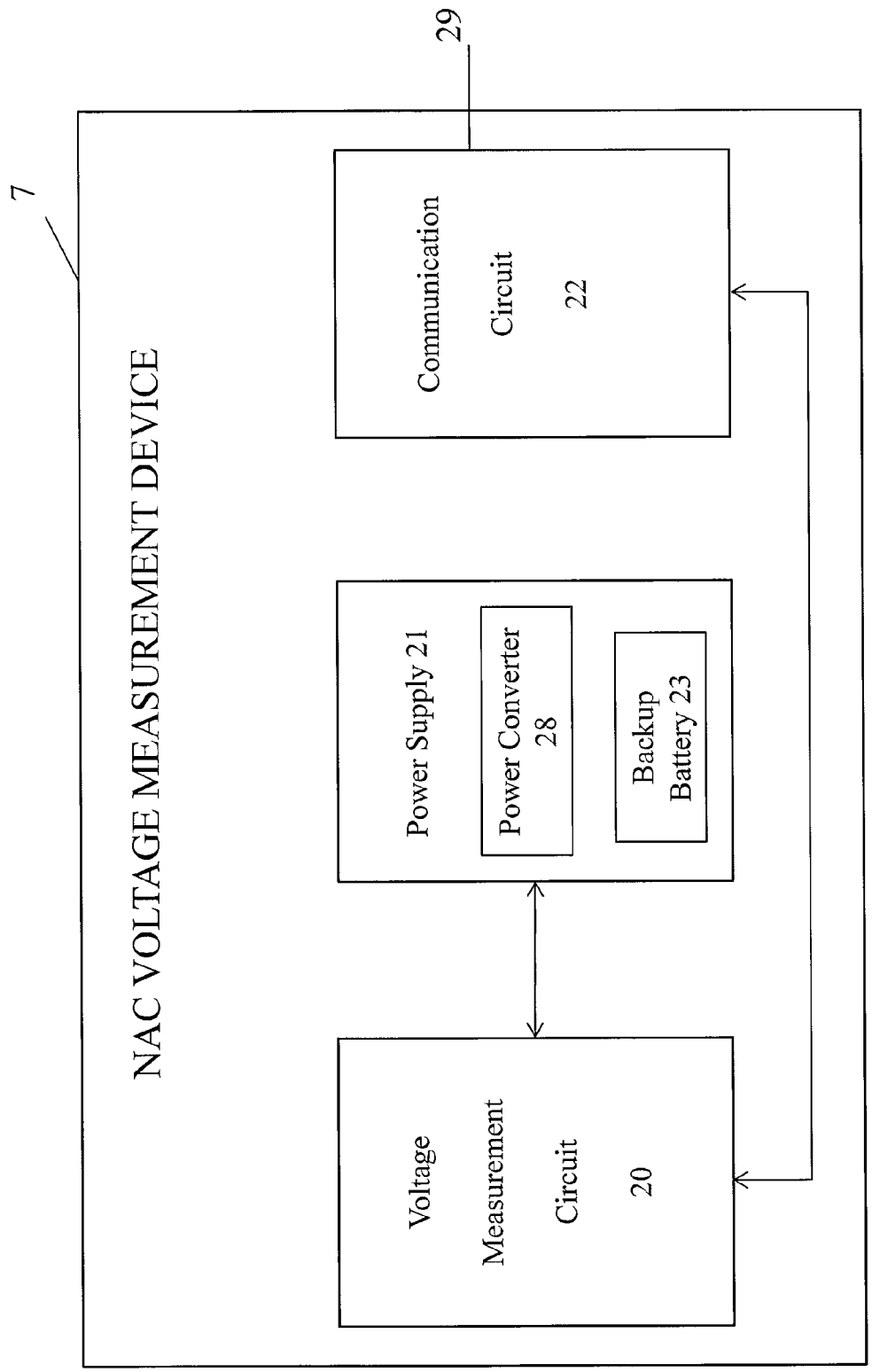
FIG. 3 illustrates one embodiment of a NAC voltage measurement device.

FIG. 3 is a block diagram of the NAC voltage measurement device 7 depicted in FIG. 1. As shown in FIG. 3, the NAC voltage measurement device 7 may include a general purpose voltage measurement circuit 20, a power supply 21, and a communication circuit 22. In one embodiment, the power supply PWR may supply a suitable voltage to the NAC voltage measurement device. As shown in FIG. 3, the power supply 21 may include a backup battery 23 that supplies a backup voltage to the NAC voltage measurement device 7, such as when the power supply PWR from the system controller 2 is unavailable. Alternatively, the power supply 21 may be coupled to a second power supply. The power supply 21 may include a power converter 28 that converts the input voltage to a suitable voltage that operates the circuitry of the voltage measurement circuit 20 and communication circuit 22.

The voltage measurement circuit 20 may measure a voltage on any portion of the NAC 5. For example, the voltage measurement circuit 20 may measure a voltage on the wires 3 and 4 across any of the NAC appliances 6. As shown in FIG. 1, the voltage measurement circuit 20 measures a voltage on the wires 3 and 4 of the NAC appliance 6 located closest to the NAC voltage measurement device 7. As discussed in more detail below, the voltage measurement circuit 20 determines a voltage value $V_{NAC-2}$ based on the voltage value after any NAC appliance 6, such as the last NAC appliance in the series of NAC appliances. The voltage measurement circuit 20 may include, for example, an analog-to-digital (A/D) circuit, an op-amp circuit, and a buffering circuit. The NAC appliance voltage value $V_{NAC-2}$ may be transferred to the communication circuit 22, which in turn outputs the voltage value $V_{NAC-2}$ to the transfer line 29. The system controller 2 receives the voltage value $V_{NAC-2}$ from the transfer line 29. The processing unit 9 may process various inputs from the voltage measurement device 10, system memory 8, and voltage and current measurement devices 10, 11 to determine whether there is sufficient voltage for the plurality of NAC appliances 6. Though in FIG. 1 the processing unit 9 is depicted inside the system controller 2, the processing may be performed remotely from the system controller 2.

Figure 4:
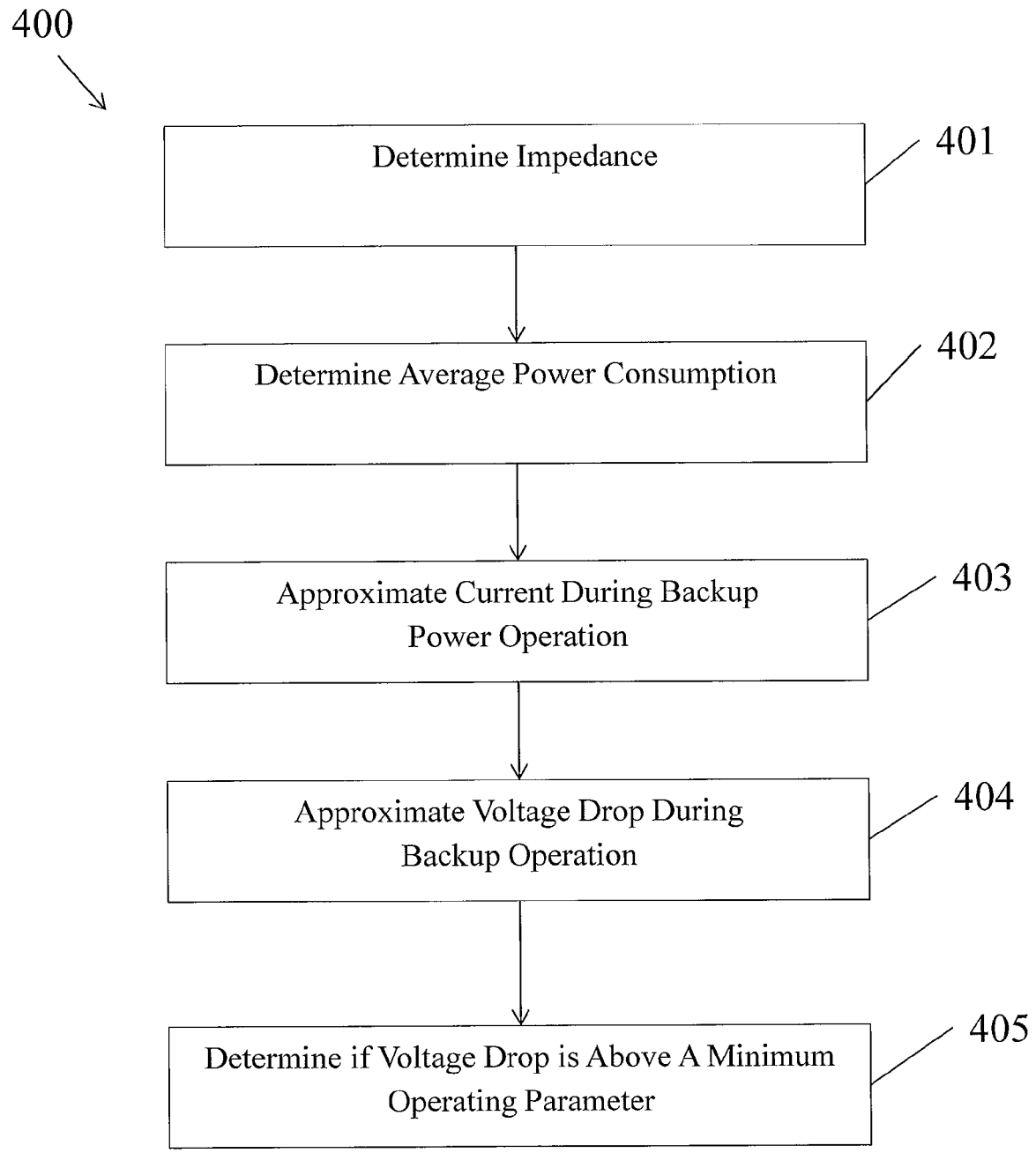
FIG. 4 is a flowchart of a method for determining whether there is sufficient voltage for operation of the NAC during backup power operation.

FIG. 4 is one example of a flow chart 400 for determining whether a NAC 5 has sufficient voltage at a backup power operation (such as battery operation) to operate one, some or all of the NAC appliances 6 in the NAC 5. For example, flow chart 400 is a method for using a monitoring system 1, which is operating at normal operation when powered by line power, to determine whether there is sufficient voltage for the plurality of NAC appliances 6 when operating using a backup voltage source BVS (such as battery power).

As shown at block 401, the monitoring system 1 determines the NAC impedance. As discussed above, the NAC impedance ($Z_{NAC}$) may be stored in a system memory 8. Once determined, the NAC impedance ($Z_{NAC}$) may be stored in the system memory 8, which communicates with the system controller 2 (as discussed above). When the impedance is needed or desired, the system memory 8 communicates the impedance to the system controller 2.

The NAC impedance may be determined in real-time. For example, the NAC impedance, during normal operation of the NAC 5, may be determined by analyzing the average voltage of the NAC ($V_{avg}$) and the NAC current ($I_{NAC}$), for example, using Equation 1.

$$Z_{NAC} = V_{Avg}/I_{NAC} \qquad \text{Equation 1:}$$

Figure 5:
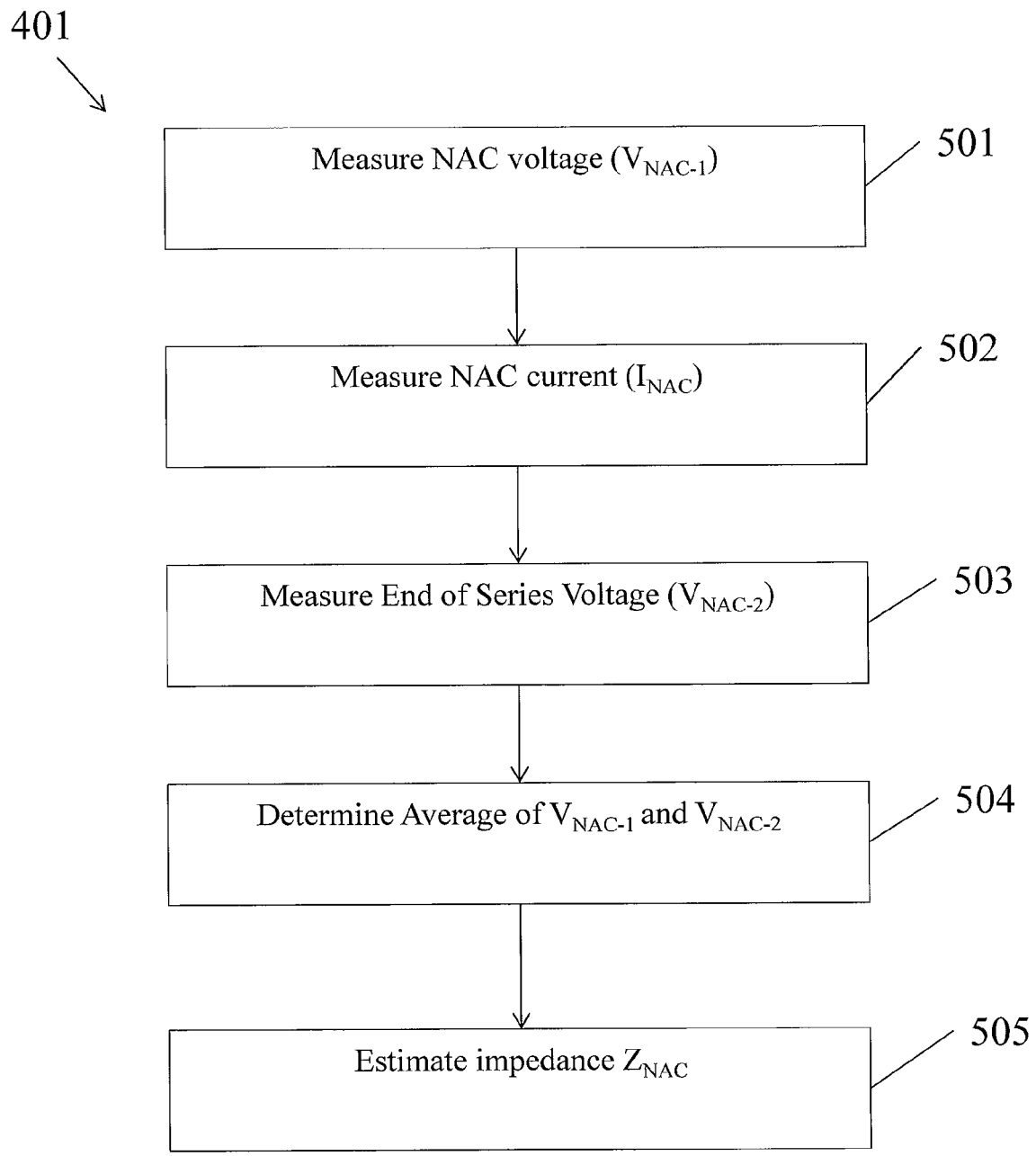
FIG. 5 is a flowchart of a method for determining an impedance of the NAC.

Referring to FIG. 5, there is shown an expanded flow chart for one exemplary embodiment of block 401. For example, as shown at block 501 and discussed above, the voltage measurement device 10 may measure the initial NAC voltage value ($V_{NAC-1}$) when the NAC is active. The current measurement device 11 measures the NAC current value ($I_{NAC}$) at block 502 when the NAC is active. The voltage measurement device 7, as shown at block 503, measures a NAC appliance voltage value ($V_{NAC-2}$) at the end of the series of NAC appliances 6 when the NAC is active. As discussed above, the initial NAC voltage value ($V_{NAC-1}$), the NAC current value ($I_{NAC}$), and the NAC appliance voltage value ($V_{NAC-2}$) may be communicated to the system controller 2. As shown in block 504, the monitoring system 1 may determine the average of the initial NAC voltage value ($V_{NAC-1}$) and the NAC appliance voltage value ($V_{NAC-2}$) when the NAC is active, for example, using Equation 2.

$$V_{avg} = (V_{NAC-1} + V_{NAC-2})/2 \qquad \text{Equation 2:}$$

The NAC impedance ($Z_{NAC}$) may also be determined in real-time, as shown in block 505, and then stored in the system memory 8. The stored NAC impedance ($Z_{NAC}$) may be used for future comparisons, determinations, or other suitable uses. For example, the stored NAC impedance ($Z_{NAC}$) may be compared to previously stored NAC impedance values. The comparison may be used to check for errors in the NAC 5. Alternatively, since the NAC impedance ($Z_{NAC}$) should remain substantially the same over time, the NAC impedance ($Z_{NAC}$) may be determined in real-time, as described above, and then stored in a system memory 8 for future determinations of the NAC impedance ($Z_{NAC}$).

As shown at block 402, the monitoring system 1 may determine the average power consumption of the NAC ($P_{avg}$). The average power consumption of the NAC ($P_{avg}$), at normal operation and low voltage operation, may be determined by analyzing the average voltage of the NAC at normal operation ($V_{avg}$) and the NAC current ($I_{NAC}$), for example, using Equation 3.

$$P_{Avg} = V_{Avg} \cdot I_{NAC} \qquad \text{Equation 3:}$$

Because of the constant power consumption NAC appliances 6, the average power consumption ($P_{avg}$) may remain substantially the same at normal operation and low voltage operation.

As shown at block 403, the current during backup power operation may be approximated. For example, the current value at battery power operation ($I_{LV}$) may be based on the power consumption of the NAC ($P_{avg}$) and the average voltage of the NAC at low voltage operation ($V_{avg-lv}$). The current value at battery power operation ($I_{LV}$) may increase if the initial NAC voltage value ($V_{NAC-1}$) is decreased (such as when the backup power source supplies the NAC 5 with power). The monitoring system 1 may determine the current value at battery power operation ($I_{LV}$) by analyzing the average power consumption of the NAC ($P_{avg}$) and the average voltage of the NAC at low voltage ($V_{avg-lv}$), for example, using Equation 4.

$$I_{LV} = P_{Avg}/V_{avg-lv} \qquad \text{Equation 4:}$$

As shown at block 404, the voltage drop ($V_{lv-drop}$) across the NAC is approximated at backup operation (such as at low voltage operation) based on the NAC impedance ($Z_{NAC}$). The voltage drop ($V_{lv-drop}$) is the loss of voltage to the NAC 5 (for example, loss due to the consumption of voltage by the NAC appliances 6 and the wires 3, 4). Consequently, the voltage drop ($V_{lv-drop}$) is based on the NAC impedance ($Z_{NAC}$) and an approximated current value at low voltage operation ($I_{LV}$). The voltage drop ($V_{lv-drop}$) may be determined by analyzing the NAC impedance ($Z_{NAC}$) and the approximated current value at low voltage operation ($I_{LV}$), for example, using Equation 5.

$$V_{lv-drop} = I_{LV} \cdot Z_{NAC} \qquad \text{Equation 5:}$$

As shown at block 405, it is determined whether the voltage drop is above a minimum operating parameter. One example of determining whether the voltage drop is above a minimum operating parameter is by first estimating the average voltage at low voltage operation ($V_{avg-lv}$) across the NAC 5. The average voltage at low voltage operation ($V_{avg-lv}$) may be determined by averaging the backup voltage ($V_{BVS-NAC-1}$) supplied to the NAC from the backup voltage source and the minimum NAC voltage ($V_{min-NAC}$), for example, using Equation 6. The backup voltage ($V_{BVS-NAC-1}$) is the voltage supplied from the backup power source BVS (minus any voltage drop created by the system controller 2) to the NAC 5. The minimum NAC voltage ($V_{min-NAC}$) is the lowest voltage that can be supplied to a NAC appliance 6 and still operate (maintain the functionality of) the NAC appliance 6.

$$V_{avg-lv} = (V_{BVS-NAC-1} + V_{min-NAC})/2 \qquad \text{Equation 6:}$$

The backup voltage value ($V_{BVS-NAC-1}$) and the minimum NAC voltage value ($V_{min-NAC}$) may be stored in system memory 8. Because the minimum NAC appliance voltage ($V_{min-NAC}$) depends on the NAC 5 of NAC appliances 6 (which may differ for different monitoring systems 1), a user may determine the minimum NAC appliance voltage ($V_{min-NAC}$) and communicate the value to the system controller 2 before, during, or after installation. Alternatively, the NAC 5 of NAC appliances 6 may communicate the minimum NAC appliance voltage ($V_{min-NAC}$) to the system controller 2. Or, a table of minimum NAC appliance voltage values may be stored in a system memory 8 and used to determine the minimum NAC appliance voltage ($V_{min-NAC}$) based on communication with the NAC 5.

Using the above calculation, the monitoring system 1 may determine whether a resulting parameter is sufficient. For example, a resulting parameter ($V_{lveol}$) may be determined by subtracting the voltage drop ($V_{lv-drop}$) from the backup voltage ($V_{BVS-NAC-1}$), for example. The resulting parameter ($V_{lveol}$) is the resulting voltage value at the end of the series of NAC appliances 6. The resulting parameter ($V_{lveol}$) represents the voltage value that will likely be at the NAC appliance 6 furthest from the system controller 2 in the series at low voltage operation.

$$V_{lveol} = V_{BVS-NAC-1} - V_{lv-drop} \qquad \text{Equation 7:}$$

If the resulting parameter ($V_{lveol}$) is less than the minimum NAC appliance voltage ($V_{min-NAC}$), the NAC 5 has insufficient voltage to maintain functionality of the NAC appliances 6 during low voltage operation (when supplied by the backup power source BVS). If the resulting parameter is greater than or equal to the minimum NAC appliance voltage, the NAC will have sufficient voltage to maintain functionality of the NAC of NAC appliances. For example, block 405 may include calculations using Equations 8 and 9, whereby Equation 8 indicates a pass (i.e., the backup power is sufficient to power the NAC) and Equation 9 indicates a fail (i.e., the backup power is sufficient to power the NAC).

$$PASS = V_{lveol} \geq V_{min\text{-}NAC} \qquad \text{Equation 8:}$$

$$FAIL = V_{lveol} < V_{min\text{-}NAC} \qquad \text{Equation 9:}$$

While the invention has been described with reference to various embodiments, it should be understood that many changes and modifications can be made without departing from the scope of the invention. It is therefore intended that the foregoing detailed description be regarded as illustrative rather than limiting, and that it be understood that it is the following claims, including all equivalents, that are intended to define the spirit and scope of this invention. For example, though FIG. 1 illustrates the voltage measurement device 7 disposed at the end of the series of NAC appliances 6, the present embodiments include other positions for the voltage measurement device 7. For example, the voltage measurement device 7 may be placed after the second, third, or fourth NAC appliance. Other modifications may likewise be made.

The invention claimed is:

1. A method for determining whether a notification appliance circuit has sufficient voltage to operate when powered by backup power, the method comprising:
    determining impedance of the notification appliance circuit;
    determining, based on the impedance, a voltage drop across at least a part of the notification appliance circuit when powered by the backup power; and
    determining, using a controller, whether, when powered by the backup power, there will be sufficient voltage to operate the notification appliance circuit based on the voltage drop,
    wherein the notification appliance circuit comprises at least one constant power notification appliance.

2. The method according to claim 1, wherein determining the impedance of the notification appliance circuit comprises estimating the impedance of the notification appliance circuit; and
    wherein determining the voltage drop across the notification appliance circuit when powered by the backup power comprises predicting the voltage drop across the notification appliance circuit when powered by the backup power and the NAC is active.

3. The method according to claim 1, wherein determining the voltage drop comprises determining the voltage drop across the entire notification appliance circuit.

4. The method according to claim 1, wherein determining the impedance includes averaging a notification appliance circuit (NAC) voltage when the notification appliance circuit is active.

5. The method according to claim 4, wherein averaging a NAC voltage comprises:
    measuring a first notification appliance circuit current when the notification appliance circuit is active;
    measuring a first voltage supplied to one end of the notification appliance circuit; and
    measuring a second voltage at a second end of the notification appliance circuit.

6. The method according to claim 5, wherein determining the voltage drop across the notification appliance circuit when powered by the backup power comprises approximating the voltage drop by determining an average power consumption of the notification appliance circuit.

7. The method according to claim 6, wherein the average power consumption of the notification appliance circuit is based on an average NAC voltage and the first notification appliance circuit current.

8. The method according to claim 1, wherein determining when powered by the backup power whether there is sufficient voltage to operate the notification appliance circuit based on the voltage drop comprises subtracting the approximated voltage drop from the voltage supplied to the notification appliance circuit when powered by the backup power, the approximated voltage drop comprising a predetermined constant amount.

9. The method according to claim 8, wherein determining whether there is sufficient voltage to operate the notification appliance circuit comprises comparing the subtraction of the approximated voltage drop from the voltage supplied to the notification appliance circuit with a minimum operating parameter.

10. The method according to claim 9, wherein the minimum operating parameter is a lowest voltage at which the notification appliance circuit is operable.

11. The method according to claim 1, wherein the notification appliance circuit is for a fire alarm system; and
    wherein determining, based on the impedance, a voltage drop across at least a part of the notification appliance circuit when powered by the backup power comprises simulating the voltage drop across at least a part of the notification appliance circuit for the fire alarm system when powered by backup batteries at an end of the backup batteries rated life.

12. The method according to claim 11, wherein simulating the voltage drop comprises estimating a current in the at least a part of the notification appliance circuit supplied by the backup batteries at the end of the backup batteries rated life.

13. The method according to claim 11, wherein determining when powered by the backup power whether there is sufficient voltage to operate the notification appliance circuit based on the voltage drop comprises:
    determining a voltage at an end of the notification appliance circuit by subtracting the simulated voltage drop from an estimated voltage output from the backup batteries; and
    comparing the voltage at an end of the notification appliance circuit with a predetermined minimum voltage for operating at least a part of the notification appliance circuit.

14. The method according to claim 13, wherein the notification appliance circuit comprises a plurality of notification appliances; and
    wherein the predetermined minimum voltage for operating at least a part of the notification appliance circuit comprises a predetermined minimum operating voltage for the last notification appliance at the end of the notification appliance circuit.

15. The method according to claim 1, wherein determining impedance of the notification appliance circuit comprises determining the impedance in the user-selected notification appliance circuit configuration, the user-selected notification appliance circuit configuration being selected from a plurality of potential configurations of the notification appliance circuit, the impedance of the notification appliance circuit in the user-selected notification appliance circuit configuration being different from impedance of at least one of the plurality of potential configurations of the notification appliance circuit;
    wherein determining the voltage drop across at least a part of the notification appliance circuit comprises determining the voltage drop in the user-selected notification appliance circuit configuration when powered by the backup power; and wherein determining whether there will be sufficient voltage to operate the notification appliance circuit comprises determining whether there will be sufficient voltage to operate the notification appliance circuit in the user-selected notification appliance circuit configuration based on the voltage drop.

16. The method according to claim 1, wherein each of the notification appliances in the notification appliance circuit is a constant power notification appliance.

17. A method for determining whether a notification appliance circuit has sufficient voltage to operate when powered by backup power, the method comprising:

determining impedance of the notification appliance circuit, wherein the notification appliance circuit comprises at least one constant power notification appliance;

determining, based on the impedance, a voltage drop across at least a part of the notification appliance circuit when powered by the backup power; and determining, using a controller, whether, when powered by the backup power, there will be sufficient voltage to operate the notification appliance circuit based on the voltage drop, wherein the notification appliance circuit comprises a plurality of NAC appliances in a series; and wherein determining whether there is sufficient voltage to operate the notification appliance circuit comprises:

determining, based on the approximated voltage drop, a resulting voltage at an end of the series of NAC appliances; and comparing the resulting voltage with a minimum operating voltage at which the NAC appliance is operable.

18. A notification appliance circuit monitoring system for monitoring a notification appliance circuit in an alarm notification system the system comprising:

a controller, the controller being operatively coupled to the notification appliance circuit, wherein the notification appliance circuit comprises at least one constant power notification appliance; and at least one sensor configured to sense at least one electrical parameter of the notification appliance circuit, the at least one sensor in communication with the controller, wherein the controller is operable to:

determine, based on the sensed electrical parameter, impedance of the notification appliance circuit;

determine, based on the impedance, a voltage drop across at least a part of the notification appliance circuit; and determine whether, when powered by the backup power, the notification appliance circuit will have sufficient voltage to operate based on the voltage drop.

19. The notification appliance circuit monitoring system according to claim 18, wherein the alarm notification system comprises a fire alarm system;

wherein the monitoring system comprises at least a portion of the fire alarm system; and wherein the controller comprises a system controller for the fire alarm system.

20. The notification appliance circuit monitoring system according to claim 18, wherein the notification appliance circuit comprises a plurality of notification appliance appliances in a series.

21. The notification appliance circuit monitoring system according to claim 20, wherein the at least one sensor comprises first and second voltage measurement devices, wherein the first voltage measurement device is disposed at a first end of the notification appliance circuit and the second voltage measurement device is disposed at a second end of the notification appliance circuit.

22. The notification appliance circuit monitoring system according to claim 21, wherein the at least one sensor further comprises a current measurement device that is operable to determine a current parameter of the notification appliance circuit.

23. The notification appliance circuit monitoring system according to claim 21, wherein the second voltage measurement device comprises a voltage measurement circuit that is operable to measure a voltage value at the second end of the notification appliance circuit.

24. The notification appliance circuit monitoring system according to claim 23, wherein the second voltage measurement device comprises a communication circuit that is operable to communicate with the controller.

25. The notification appliance circuit monitoring system according to claim 18, wherein the controller is configured to determine whether there is sufficient voltage to operate the notification appliance circuit by:

determining impedance of the notification appliance circuit;

determining, based on the impedance, a voltage drop across at least a part of the notification appliance circuit when powered by the backup power;

determining, based on the voltage drop, a resulting voltage at an end of the notification appliance circuit; and comparing the resulting voltage with a minimum operating voltage at which at least a part of the notification appliance circuit is operable.

26. The notification appliance circuit monitoring system according to claim 25, wherein the plurality of potential configurations of the notification appliance circuit comprises different numbers of notifications appliance circuits in series;

wherein the controller is configured to determine the voltage drop across at least a part of the notification appliance circuit in the user-selected notification appliance circuit configuration when powered by the backup power by simulating the voltage drop across at least a part of the notification appliance circuit in the user-selected notification appliance circuit configuration when powered by backup batteries at an end of the backup batteries rated life; and wherein the controller is configured to determine whether there will be sufficient voltage to operate the notification appliance circuit in the user-selected notification appliance circuit configuration is further based on at least one of the notification appliances in the notification appliance circuit.

27. The notification appliance circuit monitoring system according to claim 26, wherein the at least one of the notification appliances in the notification appliance circuit comprises a last notification appliance at the end of the notification appliance circuit in the user-selected notification appliance circuit configuration; and wherein the predetermined minimum voltage for operating at least a part of the notification appliance circuit comprises a predetermined minimum operating voltage for the last notification appliance at the end of the notification appliance circuit in the user-selected notification appliance circuit configuration.

* * * * *